United States Patent
Beadle et al.

(10) Patent No.: US 7,668,526 B2
(45) Date of Patent: Feb. 23, 2010

(54) FREQUENCY MIXER USING CURRENT FEEDBACK AMPLIFIERS

(75) Inventors: Edward R. Beadle, Melbourne, FL (US); Roy Vaninetti, Melbourne, FL (US); John F. Dishman, Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 466 days.

(21) Appl. No.: 11/623,429

(22) Filed: Jan. 16, 2007

(65) Prior Publication Data

US 2008/0171540 A1 Jul. 17, 2008

(51) Int. Cl.
H04B 1/18 (2006.01)

(52) U.S. Cl. .............. 455/293; 455/194.2; 455/195.1; 455/253.2

(58) Field of Classification Search .......... 455/293, 455/194.2, 195.1, 253.2, 196.1, 208–209, 455/252.1, 550.1, 556.1, 575.1, 90.3, 255, 455/258–259, 264–265, 311, 326, 330, 333–334, 455/341, 230
See application file for complete search history.

(56) References Cited

U.S. PATENT DOCUMENTS

| | | | |
|---|---|---|---|
| 4,109,215 A * | 8/1978 | Comer et al. | 330/254 |
| 4,891,649 A | 1/1990 | Labaar et al. | 342/203 |
| 5,451,908 A * | 9/1995 | Bohme | 330/300 |
| 5,574,405 A | 11/1996 | Razavi | 331/2 |
| 5,821,825 A | 10/1998 | Kobayashi | 331/66 |
| 5,838,031 A | 11/1998 | Kobayashi et al. | 267/197 |
| 5,862,458 A | 1/1999 | Ishii | 465/107 |
| 5,867,777 A | 2/1999 | Yamaji et al. | 465/234.1 |
| 5,880,631 A | 3/1999 | Sahota | 330/51 |
| 5,945,878 A | 8/1999 | Westwick et al. | 330/301 |
| 6,057,555 A * | 5/2000 | Reedy et al. | 257/9 |
| 6,100,758 A | 8/2000 | Klemmer | 330/252 |
| 6,327,465 B1 | 12/2001 | Forbes | 455/307 |
| 6,362,691 B2 | 3/2002 | Forbes | 330/303 |
| 6,362,692 B2 | 3/2002 | Forbes | 330/305 |
| 6,469,582 B2 | 10/2002 | Forbes | 330/303 |
| 6,519,069 B1 | 2/2003 | Evans et al. | 359/189 |
| 6,538,330 B1 * | 3/2003 | Forbes | 257/777 |
| 6,545,544 B1 * | 4/2003 | Link et al. | 330/310 |
| 6,767,706 B2 | 7/2004 | Quake et al. | 435/6 |
| 6,879,640 B1 | 4/2005 | Agazzi | 375/295 |
| 6,963,442 B2 | 11/2005 | Yap et al. | 359/326 |
| 6,972,624 B1 | 12/2005 | Stroet | 330/254 |
| 7,044,393 B2 * | 5/2006 | Watanabe et al. | 235/492 |
| 2005/0130619 A1 | 6/2005 | Hanke et al. | 455/326 |
| 2006/0232341 A1 * | 10/2006 | Iwata et al. | 330/296 |
| 2008/0084243 A1 * | 4/2008 | Kanamori et al. | 327/589 |

* cited by examiner

*Primary Examiner*—Pablo N Tran
(74) *Attorney, Agent, or Firm*—Allen, Dyer, Doppelt, Milbrath & Gilchrist, P.A.

(57) ABSTRACT

A frequency mixer includes a semiconductor substrate. An input current feedback amplifier is formed on the semiconductor substrate and receives a radio frequency (RF) signal and a local oscillator (LO) signal. An inverting current feedback amplifier is formed on the semiconductor substrate and connected to the input current feedback amplifier for inverting the LO signal and producing a half-wave signal. An output current feedback amplifier is formed on the semiconductor substrate and connected to an output of the input and inverting current feedback amplifiers and operative as an inverting summer for the RF and LO signals such that the output polarity of the RF signal is reversed.

29 Claims, 4 Drawing Sheets

FREQUENCY MIXER USING CURRENT FEEDBACK AMPLIFIERS

FIELD OF THE INVENTION

The present invention relates to frequency mixers, and more particularly, this invention relates to monolithically formed frequency mixers that use current feedback amplifiers as a transimpedance network operating at a wide bandwidth.

BACKGROUND OF THE INVENTION

Frequency mixers are often used in telecommunications as non-linear circuits or devices that accept two different input frequencies and present: 1) an output signal equal in frequency to the sum of the input frequencies, 2) a signal equal in frequency to the difference between the frequencies of the input signals, and if not filtered, 3) various undesired intermodulation products.

Frequency mixers are often implemented using discrete components to generate the nonlinearities useful to create the "mixing action." Different prior art circuits have been used for frequency mixers, including diode bridges, Gilbert cell multipliers, log-ratio multipliers, and diode ring mixers. Both the diode bridge and Gilbert cell multiplier typically require a local oscillator (LO) signal to "flip" the polarity of a radio frequency (RF) input on a periodic basis. Typical LO signals are bipolar and of the form of a square or sinusoidal waveshape. When the LO is positive, the RF input passes to an intermediate frequency (IF) output without being sign reversed. When the LO is negative, the RF input is sign reversed as it passes to the IF output. As a result, the LO circuit "flips" the polarity of the RF signal, having the effect of multiplying by +1 or −1 (when practical circuit losses are neglected). The sign flipping induces the desired mixing action. Typical mixer prior art such as diode bridges and Gilbert cell designs have the general disadvantage of requiring high LO drive level (e.g., >0 dBm) that make them unattractive for low power applications (e.g., handheld battery operable equipment). They are also typically AC coupled on one or more ports so operation to low frequency (i.e., near DC) is limited by the coupling. In addition, the presence of coupling components prevents a monolithic realization and its attendant advantages (e.g., size, weight, and power reduction).

There are some prior art frequency mixers that are DC coupled on all its ports (e.g., LO, RF, and IF). One prior art example is FIG. 1, and it has been formed using three operational amplifiers, along with some support circuitry, as discrete components. The term operational amplifier is the common name for a circuit component known in engineering as a voltage feedback amplifier or voltage sense amplifier. The LO and RF ports are input into a first or input operational amplifier (OA1). A second operational amplifier (OA2) functions as an inverting, half-wave oscillator. A third or output operational amplifier (OA3) receives signals from the first and second operational amplifiers and functions as an inverting, summer operational amplifier.

The prior art example (FIG. 1) using the three operational amplifiers identified above has limited practical applications in RF frequency ranges. This frequency mixer (FIG. 1) using the three operational amplifiers as described above has been adequate for audio frequencies and some ultra-sonic applications (e.g., typically 20-100 KHz upper frequency), but it is inadequate for many RF applications.

For example, the diodes identified in the design are slow switching types due to low mobility carriers inherent in the part. Further, because of the discrete design methodology to realize the mixing function the diodes are not well matched, unlike what is possible on monolithic designs, so there can be significant "cross-over" distortion as the polarities are changed. Both these effects limit the upper end of the useful frequency range of this topology. An additional limitation of the frequency range is due to the performance limitations imposed by the operational amplifier (e.g., voltage feedback amplifier) topology used to implement the circuit shown in FIG. 1. The operational amplifier has well known design limitations pertaining to high frequency response. The limitations include output slew rate limitations, gain-bandwidth trade-off, and extreme sensitivity to load capacitance.

Another example of the limitations in the discrete approach is the matching and tracking required for the resistive elements. In discrete designs it is difficult to match resistive elements precisely and maintain the match over time and temperature. Monolithic circuits due to their size and structure on a common substrate provide a simple method to control the values of resistive elements at the time of manufacture, as well as time and ambient temperature variations. Violation of the match requirement induces well-known errors in the output such as common-mode signals, signal feed-thru, gain imbalance, and others.

SUMMARY OF THE INVENTION

Improving on the prior art discrete approaches is a frequency mixer shown in FIG. 3 using system-on-chip (SOC) techniques suitable for monolithic construction. This design addresses the power sensitivity of applications such as a handheld, battery operated RF transceivers. One benefit of this proposed mixing device is the ultra low-level of the local oscillator drive (<−10 dbm) which is much less than the about 0 dbm used in some prior art frequency mixers. DC coupling is present on all ports. This is beneficial because it avoids blocking capacitors and bulky ferrites that normally limit the operating frequency range and increase size as in some prior art circuits. Also, the conversion loss associated with these components is avoided, yielding a more efficient design over prior art circuits containing such components. Further, the monolithic approach also provides an opportunity for conversion gain, which in some applications may prove useful.

In accordance with one non-limiting example of the present invention, the frequency mixer can deliver a wide instantaneous operating bandwidth, for example, up to about 2 GHz, in large part due to the selection of a different amplifier topology, namely the current feedback approach. This amplifier topology provides an attendant advantage over those used in the prior art circuits such as shown in FIG. 1. The circuit, in accordance with the present invention, can provide operating bandwidth independent of local gain on each amplifier, as an example. Also, because of the design method proposed herein, the entire circuit, including resistive elements, can be on a single monolithic substrate using modern low voltage processes (e.g., SiGe), and thus, operation at voltages of 1.8 volts (or less) is practical which affords another opportunity for potentially significant power savings.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

Figure 1:
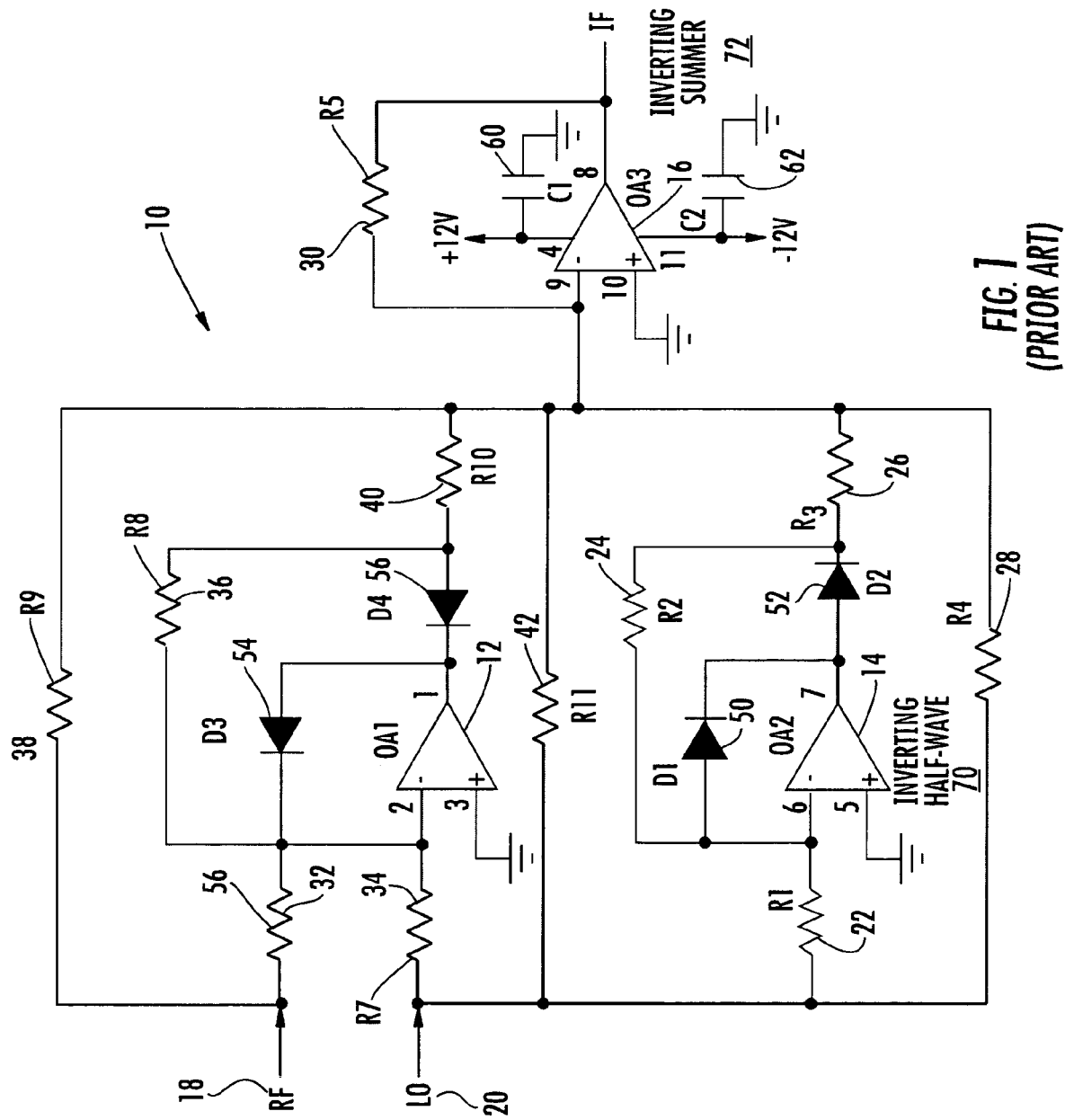
FIG. 1 is a schematic circuit diagram of a prior art frequency mixer using discrete operational amplifiers and associated components.

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

The frequency mixer, in accordance with a non-limiting example of the present invention, includes all the components generating the "mixing action" on a single semiconductor substrate. Throughout this application references to several semiconductor processes and structures are made (e.g., SOI, CMOS, BiCMOS, SiGe, MOSFET, FET). All of the semiconductor technologies mentioned in this application are compatible for producing a monolithic device. The preferred semiconductor technology embodiment for the monolithic frequency mixer integrated circuit in this disclosure is based on SiGe processes. Modern SiGe processes have the unique advantage of being able to integrate analog, RF and digital structures on a single chip using existing CMOS fabrication techniques. This is not possible with other technology, such as the Gallium Arsenside (GaAs). Another advantage of SiGe is that commercial foundries are able produce SiGe processes, which rival GaAs and InP frequency performance.

An input current feedback amplifier (122 of FIG. 3) is formed on the semiconductor substrate and receives a radio frequency (RF) signal and a local oscillator (LO) signal. An inverting current feedback amplifier (124 of FIG. 3) is formed on the semiconductor substrate and connected to the input current feedback amplifier for inverting the LO signal and producing a half-wave signal. An output current feedback amplifier (126 of FIG. 3) is formed on the semiconductor substrate and connected to an output of the input and inverting current feedback amplifiers and operative as an inverting summer for the RF and LO signals such that the output polarity of the RF signal is periodically reversed which achieves the "mixing action." The "mixing action" is primary induced by the inclusion of the diodes (140 and 141 in FIG. 3) to form rectifier circuits. The rectification is a non-linearity sufficient to produce the "mixing action" when combined in the manner shown in FIG. 3.

By using current feedback amplifiers, the gain bandwidth product limitations that plague voltage feedback configurations is avoided. Further, the current feedback amplifier avoids the slew rate limitations inherent in voltage feedback designs, and hence, greatly extends operating frequency range of the circuit topology. Additional marked speed improvements are provided where the diode types are changed. Further, in accordance with a non-limiting example of the present invention, there is provision for integrated resistive elements, which avoids well-known issues with discrete resistors.

The frequency mixer (FIG. 3) includes two Schottky barrier diodes connected to a respective output of the input current feedback amplifier and the inverting current feedback amplifier through an optimized feedback network (130 and 132). The feedback networks are designed to provide necessary compensation of the frequency response over the operating bandwidth typical of current feedback amplifiers driving capacitive loads, as well as, achieving optimum trade of gain flatness for noise degradation. The fundamental internal topology of each current feedback amplifier (FIG. 3) is typically intended to be identical. The transistors used to comprise the current feedback amplifiers are preferably on a high-speed process (e.g., SiGe BiCMOS) that will also support construction of all the other components comprising the mixer.

The diodes can be formed, as a non-limiting example, on current 300+ GHz process and SiGe diodes, similar to the transistors. It should be understood that compatible processes could be used. A major consideration of process selection is that all circuit elements must be able to be formed and operable with desirable characteristics on a single substrate to ease design and manufacturing.

In another aspect, a plurality of resistors are connected to each of the current feedback amplifiers. The resistors could be formed as pinch resistors or epitaxial resistors. As with the diodes, the resistors should be made with a process compatible with the diodes and amplifiers. The pinch resistor could be formed as a SiGe MOSFET voltage controlled resistor.

The frequency mixer could also include an RF signal input resistor and LO signal input resistor, each formed as a pinch resistor and operatively connected to the input current feedback amplifier. These elements form the basis for impedance matching to the source of the RF and LO signals. More complex matching circuits may be required in some applications, however, due to the nature of the RF and LO sources.

Signal level gain, without a loss of operating bandwidth, is possible at any point in the circuit by proper control of the feedback networks across the amplifiers. This design philosophy is well-known in the art of amplifier design. This degree of freedom, however, is not afforded the mixer designer when voltage feedback amplifiers are used.

Figure 5:
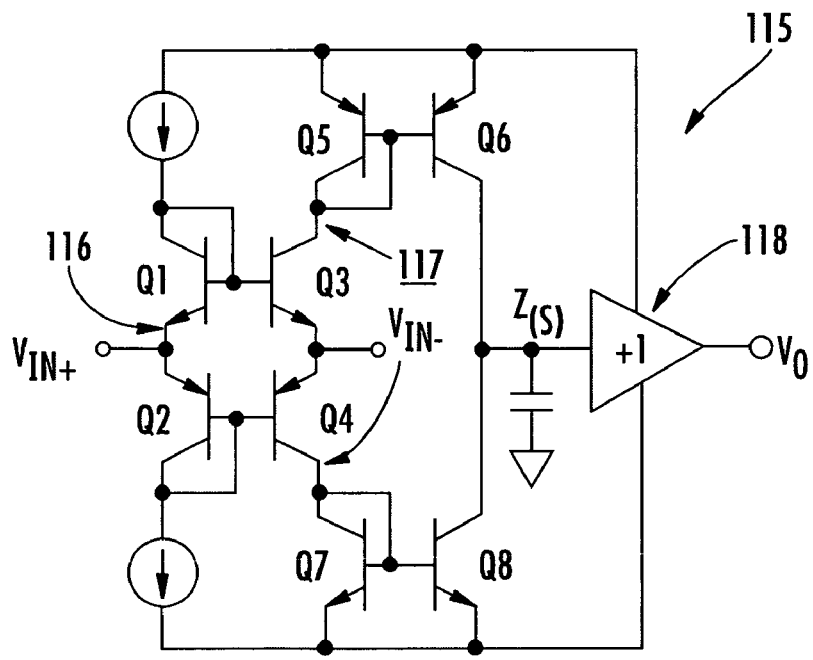
FIG. 5 is a schematic circuit diagram of a current feedback amplifier circuit design illustrating a method of construction achieving the current feedback function that can be used in accordance with a non-limiting example of the present invention.

Each of the current feedback amplifiers can be formed as an input stage and current mirrors with some additional circuitry. A high-level circuit example of a design is shown in FIG. 5.

A monolithically formed frequency mixer, in accordance with a non-limiting example of the present invention, is produced as a system-on-chip (SOC) circuit design on a semiconductor substrate from elements using silicon germanium (SiGe) BiCMOS or similar technology, and using a transimpedance network formed from transimpedance amplifiers, e.g., current feedback amplifiers and their associated support circuitry. High mobility carrier and low capacitance diodes, for example, SiGe Schottky barrier type diodes, can be used as they possess the benefit of low capacitance, resulting in an increased switching speed. The capacitance is also exploited in this design to induce moderate gain peaking in the feedback response for compensation of the amplifier frequency roll-off and extend the useful operating frequency range of the amplifier sub-circuits and the mixer as a whole. In prior art voltage feedback designs, the capacitance of the diodes presents disadvantages due to the limited ability of voltage feedback amplifiers to drive capacitive loads. Current feedback amplifiers, such as those used in the circuit of FIG. 3, have no such restrictions.

Avoiding the use of discrete resistors can be important in this application. As such, active resistors are used, for example, pinch resistors that extend in range above 50K. The advantage is that these resistors can be altered by "programming" (e.g., they are not a fixed value and are controlled by the pinching effect of a semiconductor). These resistors, however, have a requirement for additional control circuitry. Epitaxial resistors, however, are "grown" at the time of manufacture and are of fixed value with no option for change at a later date. Epitaxial resistors, unlike active resistors, have a "footprint" that is related to the resistive value desired, hence, larger values require larger substrate areas. For this reason, epitaxial resistors are not a good choice to implement numerous high value resistors. Epitaxial resistors, however, are a good option when fixed, low-values (e.g., <10K ohms) are acceptable.

In considering the value of the resistors, which can impact the choice between active or epitaxial implementations, the circuit parasitics inherent in practical designs must be considered. Larger resistive values could be used as they limit the amplifier drive current required which reduces the circuit power dissipation. A limiting factor on the value of the resistors, however, is the stray capacitance forming parasitic filters, which would limit the frequency performance. As such, any designs should carefully weigh the trades of power dissipation and operating bandwidth requirements when selecting resistor values.

The trade space of active versus epitaxial implementation requires consideration by the designer. Each method is compatible with monolithic designs and offers similar advantages relative to the discrete design of the prior art (FIG. 1).

The preferred technology for this circuit is a low voltage, silicon on insulator (SOI) or metal oxide semiconductor (MOS) manufacturing process. These process yield a much lower voltage operation (i.e., typically 1.8 volt or below) and hence can save up to 10 times the power as compared to more standard techniques which often require much higher operating voltages (i.e., around 12 volts).

Another advantage is that DC coupling can be used on all ports. This eliminates the need for coupling capacitors or ferrites typically of RF mixers. Also, because the device proposed is active, a conversion gain can be achieved instead of the typical conversion loss occurring.

Also, an ultra-low local oscillator (LO) power can be used as compared to standard approaches that require 0, +7, +10 dbm. This is because the active devices will provide gain for any signal presented to the input. Hence the high open loop gain of the amplifier can effectively amplify a very low level LO signal (e.g., −10 dBm or less).

Figure 3:
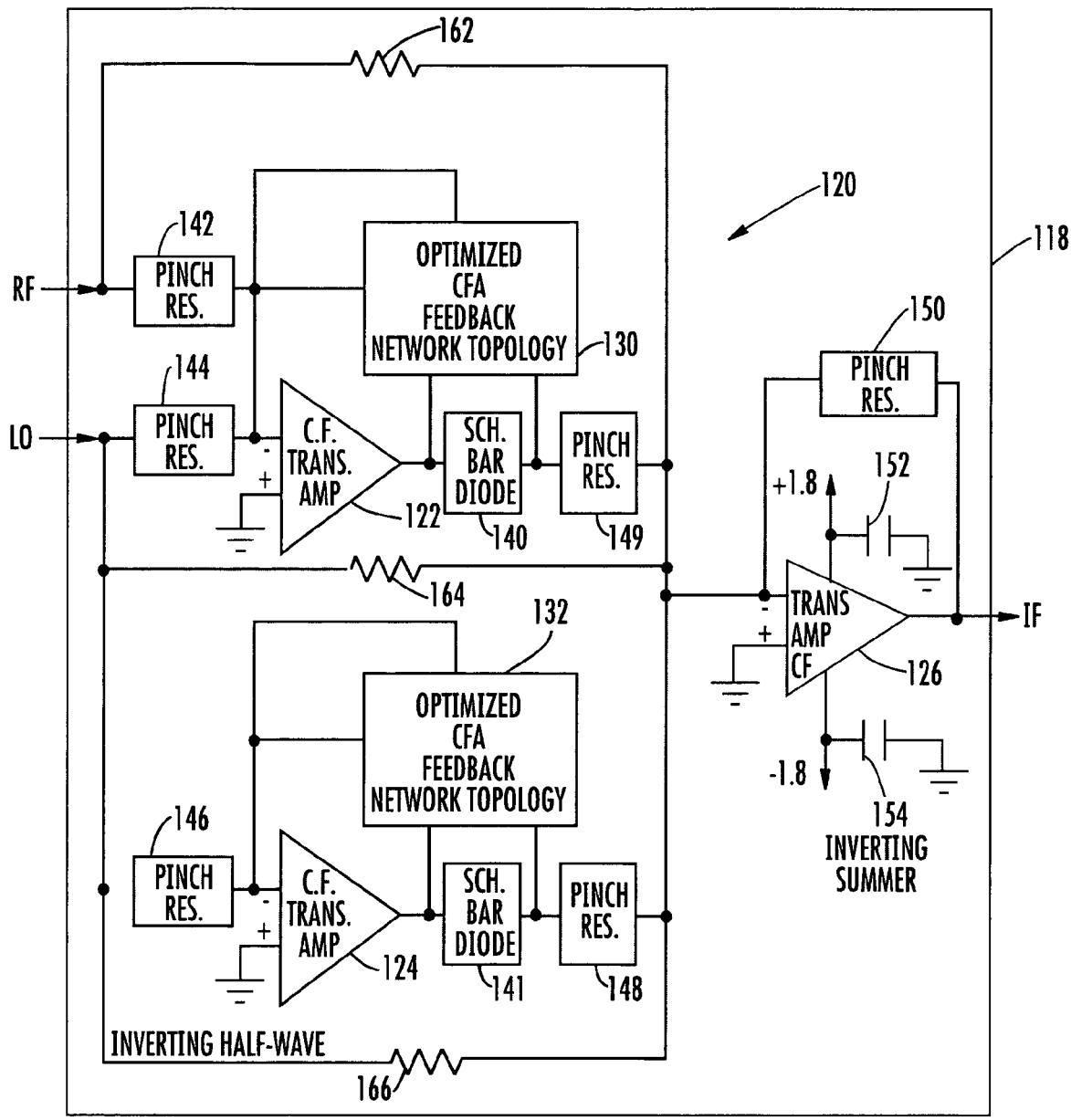
FIG. 3 is a schematic circuit diagram showing basic block components that can be used in a monolithically formed frequency mixer circuit that forms a system-on-chip (SOC) design in accordance with a non-limiting example of the present invention.

The feedback network topology 130, 132 of FIG. 3 are two-port networks that can use resistive and/or capacitive elements arranged in manner to compensate (e.g., "flatten") the frequency response of the amplifier circuits due to various practical circuit effects (e.g., stray capacitances, diode junctions, frequency response effects inherent in particular designs of the current feedback amplifier, etc.). Similarly, it might be advantageous in some applications (e.g. depending on the drive requirements and load characteristics) to include some frequency compensation in 150 in the same manner as in 130 and 132. Typical of the 2-port compensation networks are lag-lead, lag, and lead networks, well-known in the art of compensating amplifiers and other feedback system structures.

The system-on-chip (SOC) circuit design is monolithically formed on a semiconductor substrate and does not use discrete components as in the prior art frequency mixer shown in FIG. 1.

SiGe BiCMOS component processing for monolithic integrated circuits is preferably used. The SiGe processes and associated components can integrate analog, RF and digital on a single chip, using existing CMOS fabrication techniques. This type of processing is typically not possible when other technologies are used, for example, Gallium Arsenide (GaAs). The (currently available) 350 GHz SiGe processes, such as developed by IBM, can possibly be used. This would provide semiconductor elements with greatly improved frequency response characteristics over current designs. Other speed improvements compared to discretely formed prior art frequency mixers occur because of fundamental diode changes and amplifier topology changes. The amplifier topology change removes the gain-bandwidth trade-off inherent in a prior art design shown in FIG. 1. The use of integrated resistors allows a complete SOC mixer capable of wideband RF operation to be fabricated and achieve low voltage/low power operation and maintain DC coupling on all ports.

FIG. 1 is a schematic circuit diagram of a prior art frequency mixer 10 using discrete components formed on a semiconductor substrate 11, including three operational amplifiers 12, 14, 16 and labeled OA1, OA2, and OA3. Radio frequency (RF) and local (LO) inputs 18,20 are illustrated at the left and feed input resistors 32,34 labeled R6, R7. The resistors 22, 24, 26, 28, 30, 32, 34, 36, 38, 40 and 42 (R1-R11) are illustrated. In this embodiment, R1, R2, R3, R6, R7, R8 and R10 equal R, typically about 10K resistors. R4, R5, R9 and R11 typically are 2R, or about 20K in this prior art example. Each operational amplifier 12, 14, 16 could be formed as a ¼ LM6134 OP AMP device.

This type of operational amplifier (e.g., LM6134) can be formed as a dual and quad low power, 10 MHz rail-to-rail, input/output operational amplifier. Although the device is rated to 10 MHz, practical issues in the circuit design will limit its utility to well below 1 MHz. For example, if the input signal exceeds a slew rate of the input stage, and the differential input voltage rises above a diode drop, it causes difficulty with the preferred operation. Even for moderate slew rates, there still exist other issues such as with capacitive loads. These loads can decrease the phase margin of operational amplifiers or even cause the circuit to have undesired oscillations due to the output resistance of the amplifier and load capacitance forming an R-C phase lag network.

Returning again to the prior art frequency mixer shown in FIG. 1, four diodes 50, 52, 54, 56 are illustrated and labeled D1, D2, D3 and D4. An example diode could be a 1N914 diode, which could be fabricated using planar silicon processes and encapsulated in a hermetically sealed, leaded glass. This class of discrete diode usually has a switching speed of around 4 nanoseconds. The switching speed is a parameter controlled by the carrier lifetime, and long carrier lifetimes manifests itself as a contributor to the limitation of operating bandwidth of the circuit. Capacitors 60, 62 and labeled C1, C2 are grounded and connect to operational amplifier 16 power terminals 64, 66. The capacitors shown in the figure are discrete and typically of the value 1 microfarad.

FIG. 1 shows the general schematic circuit diagram of this prior art frequency mixer with the interconnected operational amplifiers and the various resistors and diodes as discrete components. This frequency mixer 10 is operative to use a square wave LO to flip the polarity of the RF input 18. The second operational amplifier OA2 and D1, D2, R1 and R2 form an inverting half-wave rectifier at 70, which inverts the LO, and outputs the positive half of the waveform from D2. The components R3, R4, R5 and the output or third operational amplifier OA3 form an inverting summer 72. Because R5 and R4 are twice the value of R3, the inverted half wave rectified LO is added at double the amplitude with the LO. These components form a full wave rectifier. The square wave LO input results in a negative DC output at the first or input operational amplifier OA1, with a magnitude equal to the level of the LO.

The remaining components, along with the third or output operational amplifier OA3 and R5, form a variation of the full wave rectifier. This variation has two inputs summed at the inverting input of the first or input operational amplifier OA1. The RF and LO inputs are summed, inverted, and half-wave rectified. Diodes D3 and D4 are reversed from the rectifier formed around the second operational amplifier OA2. As a result, negative values are output from D4.

The third or output operational amplifier OA3 acts as an inverting summer circuit 72 for the RF (through R9), the LO (through R11), and their inverted, half-wave rectified sum (through R10). Because R5, R9 and R11 are twice the value of R10, the half-wave rectified sum is added at double the amplitude with the original RF and LO signals. The resulting waveform has a positive DC bias equal to the magnitude of the LO. Combining this result with the negative DC voltage developed by the second operational amplifier OA2 and output or third operational amplifier OA3 cancels the two DC terms, and the desired waveform has an ideally zero DC bias.

The waveforms displayed in the signal graphs of FIGS. 2A-2G show that the IF output is the same as the RF signal when the LO is positive. The IF output polarity is flipped whenever the LO is negative. This is a desired mixing action.

To avoid distortion, the LO amplitude is greater than the RF amplitude. Also, twice the sum of the LO and RF is less than the power supply voltage to avoid clipping. A single 10-KΩ resistor can be substituted for the parallel combination of R4 and R11. The frequency mixer circuit can be summarized in the following equation for the instantaneous voltage output:

$$IF = [RF + LO2 \times \text{HALF}(RF+LO) + \text{FULL}(LO)]$$

When LO>0, this becomes:

$$IF = [RF + LO - 2(RF+LO) + LO] = RF$$

When LO<0, this becomes:

$$IF = (RF + LO - 0 - LO) = -RF,$$

where HALF(RF+LO) represents the positive half wave rectification of (RF+LO), and FULL(LO) represents the full wave rectified LO, and the magnitude of the LO is greater than the magnitude of the RF; so IF+RF when LO>0, and IF+−RF when LO<0.

This prior art frequency mixer 10 is DC coupled on all three ports, as compared to many prior art diode bridge mixers that include transformers or capacitors as coupling elements to external signals on one or more ports, which extends the operating frequency in lower frequency regimes.

A typical diode bridge mixer requires an LO large enough (e.g., +7 dbm) to turn on two diodes. The prior art frequency mixer 10 does not have this requirement. The LO level can be small, as long as it is greater than the RF. Also, this frequency mixer 10 does not have the 6 dB loss found in some prior art diode bridge mixers. The frequency mixer 10 does not use transformers and includes a high input impedance and low output impedance as found in most operational amplifier circuits.

Although there are benefits to the frequency mixer 10 circuit design as described above, it is useful only at low frequencies, for example, audio frequencies. The frequency mixer 10 as described does not work well at much higher RF frequencies or over a broad range of frequencies and has other disadvantages, relative to the invention, as described herein.

Figure 2A:
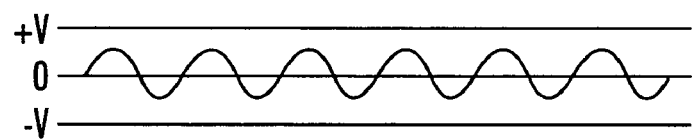
FIGS. 2A-2G are graphs showing the waveforms of the intermediate frequency (IF) output produced from the frequency mixer shown in FIG. 1.
Figure 2B:
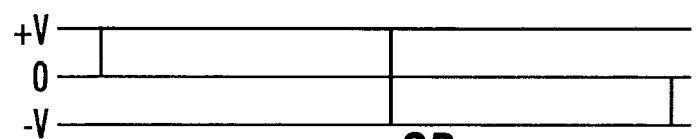
Figure 2C:
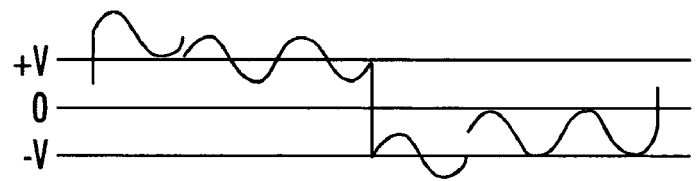
Figure 2D:
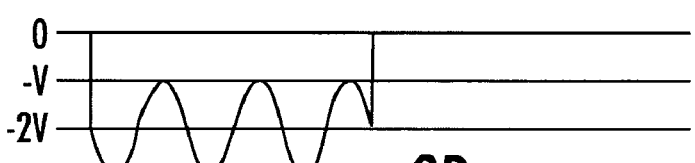
Figure 2E:
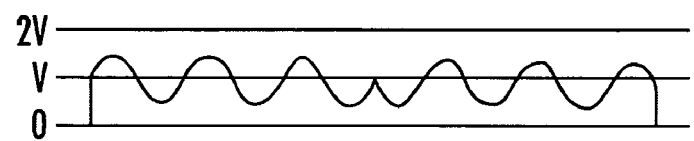
Figure 2F:
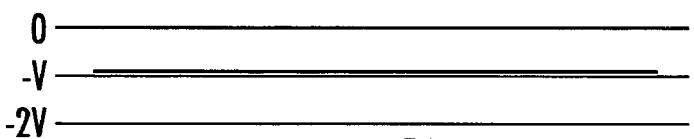
Figure 2G:
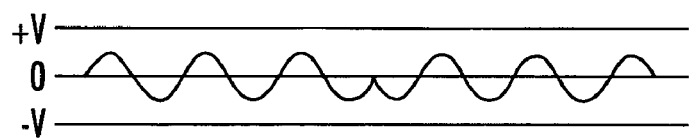

FIGS. 2A-2G show intermediate frequency waveforms at different stages in the frequency mixer 10 shown in FIG. 1. The radio frequency signals shown in FIG. 2A and the local oscillator signal shown in FIG. 2B are summed to form the waveform in FIG. 2C. This sum is inverted, rectified, and doubled in amplitude as shown in FIG. 2D. The inverted sum of the waveforms in FIGS. 2C and 2D flips according to the local oscillator, but has a DC offset as shown in FIG. 2E. The IF output shown in FIG. 2G is the inverted sum of the signal shown in FIG. 2E and the full-wave rectifier local oscillator signal shown in FIG. 2F. The final waveform flips when the local oscillator signal is negative and has its original polarity when the local oscillator is positive, yielding the desired mixing action.

This type of prior art schematic circuit diagram shown in FIG. 1 and explained relative to the signal waveforms shown in FIGS. 2A-2G is adequate at audio frequencies, but does not operate well with much higher radio frequency (RF) signals.

Referring once again to FIG. 3, there is illustrated a monolithically formed frequency mixer in accordance with a non-limiting example of the present invention. Components are formed monolithically on a common semiconductor substrate. Discrete components are not used. Instead, a system-on-chip (SOC) circuit design is encompassed. Instead of discrete operational amplifiers (i.e., voltage feedback amplifiers) as in the devices of FIG. 1, a monolithically formed transimpedance circuit is formed from three transimpedance amplifiers as current feedback amplifiers.

Figure 4:
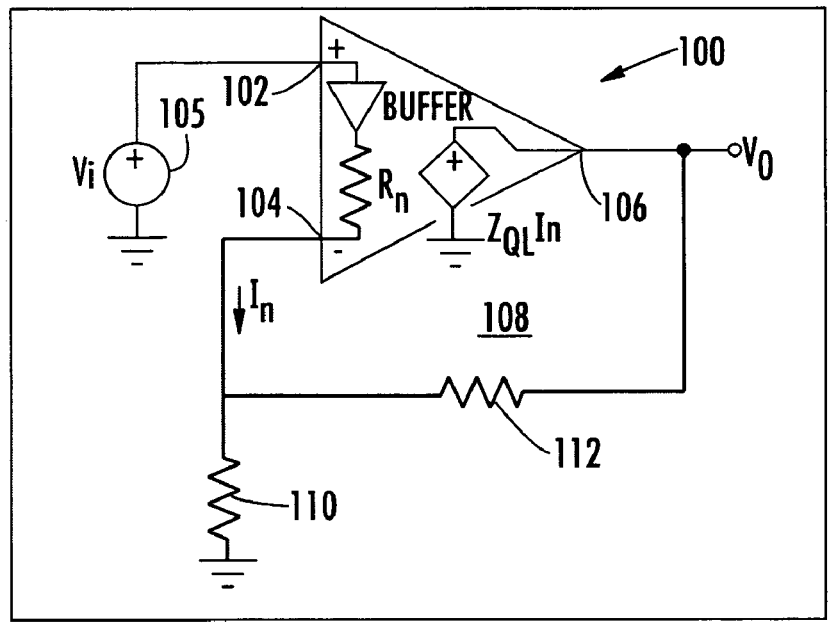
FIG. 4 is a high-level schematic circuit model diagram of an example of a transimpedance amplifier, e.g., current feedback amplifier, which can be used in the circuit shown in FIG. 3 in accordance with a non-limiting example of the present invention.

FIGS. 4 and 5 are schematic circuit diagrams showing current feedback amplifiers that can be used for the transimpedance network.

FIG. 4 is a high-level circuit diagram, suitable for behavioral circuit analysis, showing an example of a current feedback amplifier 100 with the non-inverting input 102 as a high impedance input of a unity gain buffer and the inverting input 104 as a low impedance output terminal. Other components include a signal source 105, an output 106 and feedback loop 108. A buffer 109 allows an error current to flow in or out of the inverting input and the unity gain of the input buffer forces the inverting voltage input to track the non-inverting input. An error current, flowing into/from the inverting terminal, is "sensed" by the amplifier and mirrored to the output using circuitry modeled as a current-dependent voltage source (106). The "gain" of the source is in units of Ohms. The current into/from the inverting input node ($V_{IN-}$) (see FIG. 5 or 104 on FIG. 4) can be used to find a closed-loop transfer function using standard approaches in feedback theory.

The voltage difference across the feedback resistor 112 (FIG. 4) creates an error current into the inverting input 104. For this reason, the term "transimpedance amplifier" is used because any change in the inverting input current results in a change of output voltage. The inverting input 104 can source and sink high transient currents because it is not limited by a bias current such as voltage feedback amplifiers. This can be explained while referring to a more detailed diagram (FIG. 5) of a representative current feedback design. In FIG. 5, the current mirrors (Q5-Q8) can supply current on demand to a high impedance node from a power supply to aid the high slew rate. The impedance effectively forms the open loop gain of the amplifier and is measured in Ohms. This value is represented in FIG. 4 as $Z_{ol}$. The output voltage unity-gain buffer can drive the output 118 to the voltage required to drive the feedback error current to zero. This is achieved when the output of the amplifier circuit adjusts the voltage level such that the inverting input equals the non-inverting input. The details of the buffer are not shown as it can be realized by standard design techniques such as emitter followers connected in push-pull configurations as is well-known to those skilled in the amplifier design art.

The value of a feedback resistor connected between the buffer output and the amplifier inverting input determines the amount of current fed back to the inverting input. The value of a feedback resistor or other resistors used in this transimpedance amplifier can be adjusted to vary the gain of the current feedback amplifier as is well known in the art.

It should be understood that the phrase "current feedback" refers to a closed-loop configuration in which the error signal used for feedback is in the form of current. Thus, the current feedback operational amplifier as illustrated responds to an error current at one of its input terminals rather than from an error voltage to produce a corresponding output voltage. This architecture achieves a closed-loop result when the feedback system stabilizes at a zero differential input voltage and zero the input current on the inverting node. The operating principle of current feedback amplifiers is well accepted and has inherent benefits for the mixer. A major benefit exploited in this configuration is that current sensing, rather than voltage sensing, provides greatly improved bandwidth as well as freedom from slew rate limitations incurred by typical voltage feedback amplifiers due to their topology.

Referring again to FIG. 5, a simplified diagram of a current feedback amplifier 115 at the transistor level, showing an input stage 116 and current mirrors 117 formed by the various transistors Q1-Q8 is illustrated. The transistors shown are illustrated with symbols typical of bipolar junction transistors and are for illustration purposes. Anyone skilled in the art of amplifier design can readily appreciate the functionality represented by the arrangement of the circuit components and translate the functions into equivalent structures using other transistor types (e.g., junction field effect, metal oxide field effect, etc.) compatible with specific design objectives. Current feedback amplifiers have excellent slew rate capabilities far exceeding the voltage feedback configurations. The low impedance input (Vin−) allows transient currents to flow freely into the amplifier as required, avoiding limitations well known with voltage feedback designs. The internal current mirrors 117 allow an input current to be conveyed to a compensation node (node Z(s) in FIG. 5), allowing a fast charging and discharging in proportion to an input step size. Thus, the faster slew rate can allow a quicker rise time and a lower induced distortion and non-linearity with a much wider bandwidth large signal frequency response than conventional approaches. As to node Z(s), the compensation node is included to aid stability in the design. The size of the capacitance can be expected to be on the order of 10 picofarads. But unlike voltage feedback amplifiers, the current to charge/discharge this capacitance does not have the same limitations hence it is not a slew rate limitation.

The current sources in FIG. 5 act as active loads for the input stage to increase the impedance on the Vin+node without requiring large value resistors to be fabricated. This technique is well-known in the art of integrated circuit design and the current feedback amplifier designer chooses these currents by balancing the requirements of power dissipation, current source complexity, and amplifier input impedance.

Current feedback operational amplifiers typically have large DC offsets and higher current noise as compared to other types of amplifier configurations, but they also provide the necessary benefit of high slew rates. The DC levels can be accommodated by a number of methods such as pre-calibration or inclusion of external trimming circuits. These approaches are well-known. The current noise can be effectively minimized by limiting the values of the resistive elements in the circuit, as well as by design of the bias circuitry in the amplifiers if desired.

The transimpedance (or current feedback) amplifiers, used in accordance with non-limiting examples, can be formed by a complimentary bipolar process or other similar process. Compatible with monolithic design and operational requirements (e.g., frequency band, power, etc.) of the design. The motivation for using current feedback is expressed above. Current-mode architectures provide improved bandwidth over voltage sensing approaches. Also, the current feedback topology has an inherent insensitivity to the programmed closed loop gain (set by external resistive components, for example), unlike its voltage feedback counterparts. Thus, the current feedback topology can achieve gain without sacrificing bandwidth.

It should be understood that the frequency mixer 120 is formed on a semiconductor substrate 118 and includes three transimpedance amplifiers 122, 124, 126 formed as current feedback amplifiers. The transimpedance amplifiers 122, 124 include an optimized amplifier feedback network topology 130, 132. These circuits 130, 132 can be bench designed using standard approaches in feedback theory such as lag-lead, lag, or lead networks. As mentioned above, the purpose of these networks is to maintain preferred frequency response over as wide a bandwidth as possible. The transimpedance amplifiers 122, 124 output signals to Schottky barrier diodes 140, 141 as output diodes. Pinch resistors 142, 144, 146, 148, 149, 150 are illustrated and preferably are used in at least a portion of the circuit, but shown as used in most sections of the circuit. The inputs for the RF and local oscillator signals feed an input amplifier 122. The inverting half-wave amplifier 124, together with the input amplifier 122, are connected to an output amplifier 126. The appropriate inverting half-wave and inverting summer circuits are formed as illustrated. The amplifier 126 includes grounded output capacitors 152, 154 connected to the power supply terminals of the amplifier, as illustrated. The components as illustrated are formed monolithically as a system-on-chip (SOC) circuit design in a preferred embodiment.

The Schottky barrier type diodes 140, 141 can be formed from silicon germanium (SiGe) and provide low capacitance, switching speed and gain peaking. In a non-limiting example, a Schottky barrier diode can be formed as a metal-semiconductor barrier by depositing a metal layer on a semiconductor. It can be a passivated design using a N-type or P-type silicon substrate, an N-type or P-type epitaxial layer and a passivation layer on top with an appropriate Schottky junction formed by metal in a non-limiting example. The equivalent circuit could include a parasitic series resistance. Characteristics of the Schottky diode can be selected based upon the P-type or N-type silicon and the type of metal used in the design. A N-type diode could be used for the frequency mixer 120 where the high local oscillator drive levels keep the resistor values low.

The resistors 142, 144, 146, 148, 149 and 150 could be formed as active resistors, for example, pinch resistors, which can extend in range above 50K. A pinch resistor can be formed as a monolithic silicon resistor using a P-based diffusion resistor by superimposing an N+emitter diffusion over a resistor. The surface of the P-based resistor reverts to an N-type material and a narrow "pinched" resistor is left under the P+ diffusion. It could achieve 10,000 ohms per square or higher, typically operates with low voltages and has a high temperature coefficient.

A preferred embodiment includes a pinch-type resistor, for example, a similar germanium MOSFET VCR (voltage control resistor). Epitaxial resistors are an option. For the integrated resistors in the topology shown only ratio matching is needed and in integrated circuits excellent ratio matching is achievable using standard practice.

It is also possible to use as the diode SiGe technology for 350 GHz process (about 400 picoseconds). The feedback network can be an optimized current feedback amplifier network topology that is implemented for bandwidth, noise and other factors. Typically, this will depend on the end-use designs and can be done at the design stage using well-known techniques.

As compared to the prior art frequency mixer in which the components and process require a +12 volt operation as in the circuit of FIG. 1, the frequency mixer circuit that is monolithically formed and shown in FIG. 3 can use low voltage silicon on insulator (SOI) or metal oxide semiconductor (MOS) processes to yield 1.8 volt operation (as a non-limiting example) and hence up to a nominal 10 times the power savings.

There are voltage feedback amplifiers that operate at lower voltages. However, typically one must trade bandwidth for operating voltage with those devices. Hence for a given operating voltage, current feedback amplifiers, with the absence of slew rate limitation, will always outperform voltage feedback counterparts in terms of bandwidth. To "get back" the bandwidth advantage of current feedback topologies, a voltage feedback amplifier would essentially need a larger operating voltage to develop the currents needed to slew the outputs. However, practical limitations on usable supply voltages render this course of action impossible.

The frequency mixer allows power savings by exploiting silicon-on-insulator (SOI) class construction techniques. SOI is typically a layered structure using a thin layer of silicon from about 50 nanometers to about 100 micrometers thick. It is typically created on an insulating substrate, for example, sapphire, with an insulating layer of silicon dioxide ($SiO_2$). This approach has the added benefit for the mixer that the electrical charge needed during a switching operation is decreased, thus, increasing the speed and reducing the switching energy over CMOS-based technologies without an SOI approach. The SOI construction technique can host the SiGe processes yielding a high speed but lower power device than previously possible.

In one non-limiting example, the wafers for this process could be produced by using an oxygen ion beam implantation process followed by higher temperature annealing to create a buried $SiO_2$ layer (e.g., SIMOX).

As mentioned above, SiGe BiCMOS is a preferred technology for the monolithic integrated circuit. The SiGe can integrate analog, RF and digital on a single chip using existing CMOS fabrication techniques. This is not possible with other technology, such as the GaAs. It is also possible to produce 350 GHz $F_t$ SiGe processes that rival GaAs and InP. Gain bandwidth product limitations plaguing prior art mixer topologies are avoided by changing the network topology of the amplifiers (i.e., change from voltage feedback to current feedback) with marked speed improvements introduced by diode changes and amplifier topology changes. The system can include broadband impedance matching, integrated resistors and features low voltage/"zero power" operation.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A frequency mixer comprising:
a semiconductor substrate;
an input current feedback transimpedance amplifier formed on the semiconductor substrate and receiving a radio frequency (RF) signal and a local oscillator (LO) signal;
an inverting current feedback transimpedance amplifier formed on the semiconductor substrate and connected to the input current feedback amplifier for inverting the LO signal and producing a half-wave signal; and
an output current feedback transimpedance amplifier formed on the semiconductor substrate and connected to an output of said input and inverting current feedback amplifiers and operative as an inverting summer for the RF and LO signals such that the output polarity of the RF signal is reversed.

2. A frequency mixer according to claim 1, and further comprising an output diode formed as a Schottky barrier diode and connected to a respective output of said input current feedback amplifier and said inverting current feedback amplifier.

3. A frequency mixer according to claim 2, wherein said output diodes comprise 350 GHz processed SiGe diodes.

4. A frequency mixer according to claim 1, wherein said input current feedback amplifier and inverting current feedback amplifier each include a feedback network optimized for bandwidth and noise at real-time.

5. A frequency mixer according to claim 1, and further comprising a plurality of resistors connected to each of said current feedback amplifiers.

6. A frequency mixer according to claim 5, wherein said resistors comprise pinch resistors.

7. A frequency mixer according to claim 5, wherein said resistors comprise epitaxial resistors.

8. A frequency mixer according to claim 1, wherein said output current feedback amplifier includes a feedback loop and a feedback resistor formed as a pinch resistor within the feedback loop.

9. A frequency mixer according to claim 8, wherein said pinch resistor comprises a SiGe MOSFET voltage controlled resistor.

10. A frequency mixer according to claim 1, and further comprising an RF input resistor and LO input resistor each formed as a pinch resistor and operatively connected to said input current feedback amplifier.

11. A frequency mixer according to claim 1, wherein each of said current feedback amplifiers comprises an input stage and current mirrors.

12. A frequency mixer according to claim 1, wherein said semiconductor substrate and current feedback amplifiers comprise a silicon-on-insulator (SOI) system-on-chip (SOC) device.

13. A frequency mixer comprising:
a semiconductor substrate;
a transimpedance amplifier circuit monolithically formed on the semiconductor substrate that receives a radio frequency (RF) signal and local oscillator (LO) signal and reverses the output polarity of the RF signal, and comprising, an input current feedback amplifier that receives the RF signal and the LO signal;

an inverting current feedback amplifier connected to the input current feedback amplifier for inverting the LO signal and producing a half-wave signal;

an output current feedback amplifier connected to an output of said input and inverting current feedback amplifiers and operative as an inverting summer;

an output diode formed as a Schottky barrier diode connected to each input and inverting current feedback amplifier; and a plurality of resistors connected to each of said input, inverting and output current feedback amplifiers.

14. A frequency mixer according to claim 13, wherein said output diode comprises 350 GHz processed SiGe diodes.

15. A frequency mixer according to claim 13, wherein said input current feedback amplifier and inverting current feedback amplifier each include a feedback network optimized for bandwidth and noise at real time.

16. A frequency mixer according to claim 13, wherein said resistors comprise pinch resistors.

17. A frequency mixer according to claim 13, wherein said resistors comprise epitaxially formed resistors.

18. A frequency mixer according to claim 13, wherein said output current feedback amplifier includes a feedback loop and a feedback resistor formed as a pinch resistor within the feedback loop.

19. A frequency mixer according to claim 18, wherein said pinch resistor comprises a SiGe MOSFET voltage controlled resistor.

20. A frequency mixer according to claim 13, wherein each of said current feedback amplifiers comprises an input stage and current mirrors.

21. A frequency mixer according to claim 13, wherein said semiconductor substrate and monolithically formed current feedback amplifiers comprise a silicon-on-insulator (SOI) system-on-chip (SOC) device.

22. A method of forming a frequency mixer, comprising:

forming a semiconductor substrate; and forming a monolithic transimpedance amplifier circuit on the semiconductor substrate that receives a radio frequency (RF) signal and local oscillator (LO) signal and reverses the output polarity of the RF signal, and comprising, an input current feedback transimpedance amplifier that receives the RF signal and the LO signal;

an inverting current feedback transimpedance amplifier connected to the input current feedback amplifier for inverting the LO signal and producing a half-wave signal; and an output current feedback transimpedance amplifier connected to an output of said input and inverting current feedback amplifiers and operative as an inverting summer.

23. A method according to claim 22, which further comprises forming and connecting an output diode as a Schottky barrier diode to each input and inverting current feedback amplifier.

24. A method according to claim 22, which further comprises forming a plurality of resistors connected to each of said input, inverting and output current feedback amplifiers.

25. A method according to claim 24, which further comprises forming each resistor as a pinch resistor.

26. A method according to claim 24, which further comprises forming each resistor as an epitaxial resistor.

27. A method according to claim 22, which further comprises forming the transimpedance amplifier circuit using a silicon-on-insulator (SOI) process.

28. A frequency mixer comprising:

a semiconductor substrate;

an input current feedback amplifier formed on the semiconductor substrate and receiving a radio frequency (RF) signal and a local oscillator (LO) signal;

an inverting current feedback amplifier formed on the semiconductor substrate and connected to the input current feedback amplifier for inverting the LO signal and producing a half-wave signal;

an output current feedback amplifier formed on the semiconductor substrate and connected to an output of said input and inverting current feedback amplifiers and operative as an inverting summer for the RF and LO signals such that the output polarity of the RF signal is reversed; and an output diode formed as a Schottky barrier diode and connected to a respective output of said input current feedback amplifier and said inverting current feedback amplifier.

29. A method of forming a frequency mixer, comprising:

forming a semiconductor substrate;

forming a monolithic transimpedance amplifier circuit on the semiconductor substrate that receives a radio frequency (RF) signal and local oscillator (LO) signal and reverses the output polarity of the RF signal, and comprising, an input current feedback amplifier that receives the RF signal and the LO signal;

an inverting current feedback amplifier connected to the input current feedback amplifier for inverting the LO signal and producing a half-wave signal;

an output current feedback amplifier connected to an output of said input and inverting current feedback amplifiers and operative as an inverting summer; and forming and connecting an output diode as a Schottky barrier diode to each input and inverting current feedback amplifier.

* * * * *